United States Patent
Burns

(10) Patent No.: US 9,912,130 B1
(45) Date of Patent: Mar. 6, 2018

(54) ELECTRICAL DEVICE GRIPPING TOOL

(71) Applicant: John M. Burns, Harbor City, CA (US)

(72) Inventor: John M. Burns, Harbor City, CA (US)

(73) Assignee: JOHN BURNS LIVING TRUST, Harbor City, CA (US)

( * ) Notice: Subject to any disclaimer, the term of this patent is extended or adjusted under 35 U.S.C. 154(b) by 0 days.

(21) Appl. No.: 15/658,062

(22) Filed: Jul. 24, 2017

Related U.S. Application Data

(60) Provisional application No. 62/503,279, filed on May 8, 2017.

(51) Int. Cl.
*B23P 19/00* (2006.01)
*H02G 1/00* (2006.01)
*B25B 27/02* (2006.01)

(52) U.S. Cl.
CPC ............... *H02G 1/00* (2013.01); *B25B 27/02* (2013.01)

(58) Field of Classification Search
CPC .. H01G 1/00; B25B 3/00; B25B 17/00; B25B 27/02; H02G 1/00
See application file for complete search history.

(56) References Cited

U.S. PATENT DOCUMENTS

| | | |
|---|---|---|
| 3,491,329 A | 1/1970 | Lecocq |
| 4,190,222 A | 2/1980 | Appleton et al. |
| 5,823,808 A | 10/1998 | Clark et al. |
| 5,938,458 A | 8/1999 | Krehbiel et al. |
| 6,261,123 B1 | 7/2001 | Kruger et al. |
| 6,540,532 B1 | 4/2003 | Martin et al. |
| 6,817,902 B2 | 11/2004 | Bernardi et al. |
| 6,846,455 B1 * | 1/2005 | Carney .................... B25J 15/12 318/568.22 |
| 7,244,148 B2 * | 7/2007 | Maguire ............... B60L 3/0069 439/620.28 |
| 8,562,368 B2 | 10/2013 | Boyer |

(Continued)

FOREIGN PATENT DOCUMENTS

| | | |
|---|---|---|
| CN | 103199380 B | 11/2015 |
| DE | 102013008454 B4 | 3/2016 |
| JP | 2013222618 A | 10/2013 |

OTHER PUBLICATIONS

Title: Plug Puller Daily Living Aid for Arthritis; Source: Rehab Mart; http://www.rehabmarlcom/product/plug-puller-18647.html; © 1998-2017 RehabMart.com, LLC.

*Primary Examiner* — Paul D Kim
(74) *Attorney, Agent, or Firm* — Carlos R. Villamar; The Villamar Firm PLLC

(57) ABSTRACT

Embodiments disclosed herein include devices and methods for gripping electrical components. The electrical device gripping tool may include a rotating handle, a cam assembly, and a body. The rotating handle may be attached to the assembly and the cam assembly may include a cam holder that fits over the cam to connect the rotating handle to the body. Furthermore, the body may include a first body half and a second body half that are each separately coupled to the cam such that the first body half and the second body half slide towards each other and slide away from each other with respect to a rotation of the rotating handle. In addition, shields are optionally attached to the first and second body half such that they assist in the removal of the electrical device without its terminals making contact with the containment box.

20 Claims, 19 Drawing Sheets

(56) References Cited

U.S. PATENT DOCUMENTS

| | | | |
|---|---|---|---|
| 8,964,928 B2* | 2/2015 | Barrier | G21C 19/18 |
| | | | 376/261 |
| 9,231,359 B1 | 1/2016 | Butcher et al. | |
| 9,396,894 B2* | 7/2016 | Pora | H01H 19/08 |
| 9,397,459 B2 | 7/2016 | Butcher et al. | |
| 2006/0175770 A1* | 8/2006 | Linzell | B23B 31/1612 |
| | | | 279/71 |

* cited by examiner

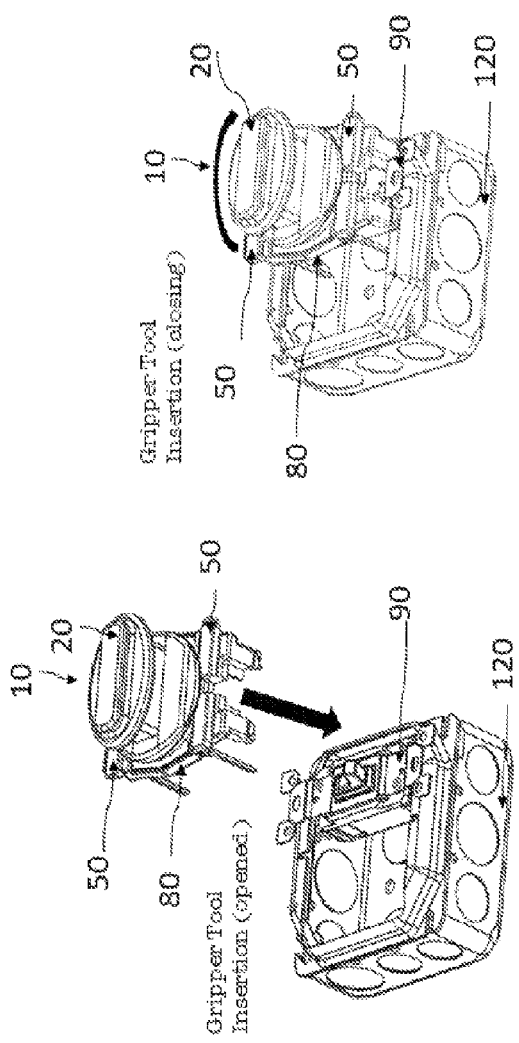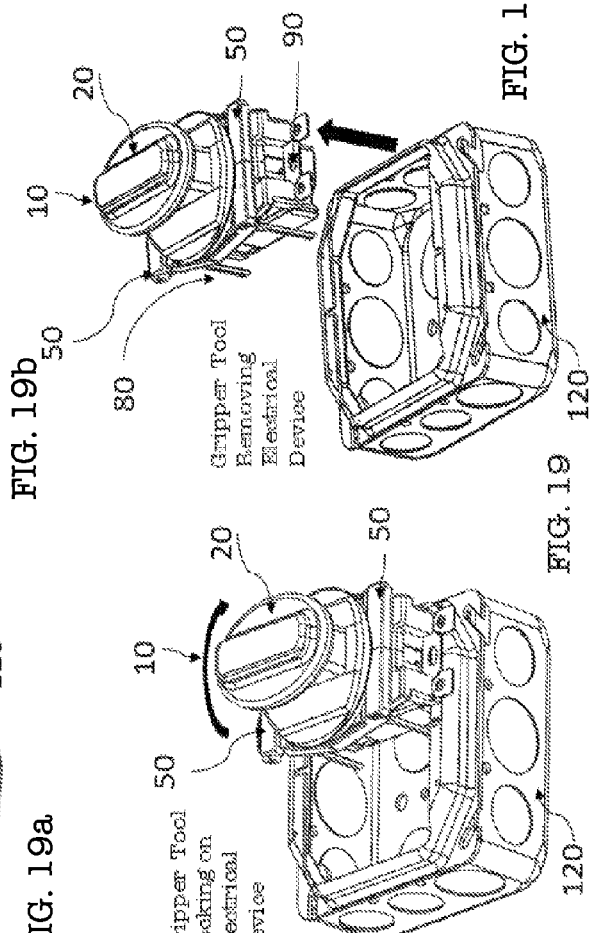

ELECTRICAL DEVICE GRIPPING TOOL

CROSS REFERENCE TO RELATED DOCUMENTS

The present invention claims priority to U.S. Provisional Patent Application Ser. No. 62/503,279 of BURNS et al., entitled "ELECTRICAL DEVICE GRIPPING TOOL AND METHOD OF USING SAME," filed on 8 May 2017, the entire disclosure of which is hereby incorporated by reference herein.

BACKGROUND OF THE INVENTION

Field of the Invention

The disclosed technology relates generally to electrical tools, and more particularly, some embodiments relate to an electrical device gripping tool and methods of using the same.

Discussion of the Background

Electrical workers are often considered to be engaged in a very dangerous profession. Electrical workers are tasked with working on high voltage, high current electrical circuits. Although electrical workers take many precautions against the risk of shock, accident still occur. Miswiring of the circuit or mislabeling of junction boxes and components can cause an electrician to be exposed to a live circuit even after he or she has taken reasonable steps to turn off the circuit. To exacerbate this problem, electrical workers are often required to manipulate electrical components with their hands or with metal tools. For example, to pull an electrical socket out of a wall box, electricians often use their hands. Consequently, they might accidentally touch the electrical posts carrying electricity to the socket.

SUMMARY OF THE EMBODIMENTS

According to various embodiments of the disclosed technology, an electrical device gripping tool is described. According to one embodiment, the electrical device gripping tool may include a handle; a body with a first body half and a second body half such that the first body half and the second body half slide towards each other and slide away from each other with respect to a rotation of the handle. Additionally, the electrical device gripping tool may also include a cam portion with a cam holder that fits over a cam to connect the handle to the body, such that the first body half and the second body half are each separately coupled to the cam.

Other various embodiments, may include a method for handling an electrical gripping tool. Some embodiments may include obtaining the electrical gripping tool with a handle; a body with a first body half and a second body half such that the first body half and the second body half slide towards each other and slide away from each other with respect to a rotation of the handle; and a cam portion with a cam holder that fits over a cam to connect the handle to the body, such that the first body half and the second body half are each separately coupled to the cam.

Other embodiments may include a shield that provides a guide to prevent accidental contact of electrical terminals with the metal enclosure of the electrical device.

Additional embodiments may include aligning the body over a part of an electrical device and rotating the handle to adjust space between the first body half and second body half so that the part of the electric device is placed in between the first body half and the second body half.

Still other aspects, features, and advantages of the present invention are clear from the following detailed description, by illustrating several illustrative embodiments and implementations, including the best mode contemplated for carrying out the present invention. The present invention is also capable of other and different embodiments, and its several details can be modified in various respects, all without departing from the spirit and scope of the present invention. Accordingly, the drawings and descriptions are to be regarded as illustrative in nature, and not as restrictive.

BRIEF DESCRIPTION OF THE DRAWINGS

The technology disclosed herein, in accordance with one or more various embodiments, is described in detail with reference to the following Figures. The drawings are provided for purposes of illustration only and merely depict typical or example embodiments of the disclosed technology. These drawings are provided to facilitate the reader's understanding of the disclosed technology and shall not be considered limiting of the breadth, scope, or applicability thereof. It should be noted that for clarity and ease of illustration these drawings are not necessarily made to scale.

Some of the Figs. included herein illustrate various embodiments of the disclosed technology from different viewing angles. Although the accompanying descriptive text may refer to such views as "top," "front," "back," "bottom" or "side" views, such references are merely descriptive and do not imply or require that the disclosed technology be implemented or used in a particular spatial orientation unless explicitly stated otherwise.

FIG. 19a is an exploded view of the of the gripping tool and a standard electrical box containing an electrical device, 19b is the gripper tool inserted into the electrical box around the electrical device, 19c is the gripper tool locked onto the electrical device, and 19d is an exploded view of the with the gripper tool and electrical device removed.

The FIGs. are not intended to be exhaustive or to limit the invention to the precise form disclosed. It should be understood that the invention can be practiced with modification and alteration, and that the disclosed technology be limited only by the claims and the equivalents thereof.

DETAILED DESCRIPTION OF THE EMBODIMENTS

Embodiments of the technology disclosed herein are directed toward devices and methods for gripping electrical component for operations such as, for example, removal, installation or handling of the electrical component. Embodiments can be configured to grip various electrical components such as, for example, electrical outlets, switches, dimmers, and other electrical components. The tool is dimensioned to conform to the geometry and configuration of the electrical component that it is intended to grip. The tool includes a body portion and a handle portion. The body portion is constructed in two halves that are slidably mounted relative to one another such that they can be separated from each other to be positioned on the electrical component, and slid together to grip the electrical component. The handle portion in some embodiments includes a cam with elliptical shaped slots to engage the body half such that when the handle portion is rotated in one direction, the body half can be moved toward one another and when the handle portion is rotated in the other direction, the body half are moved apart from one another.

Figure 1:
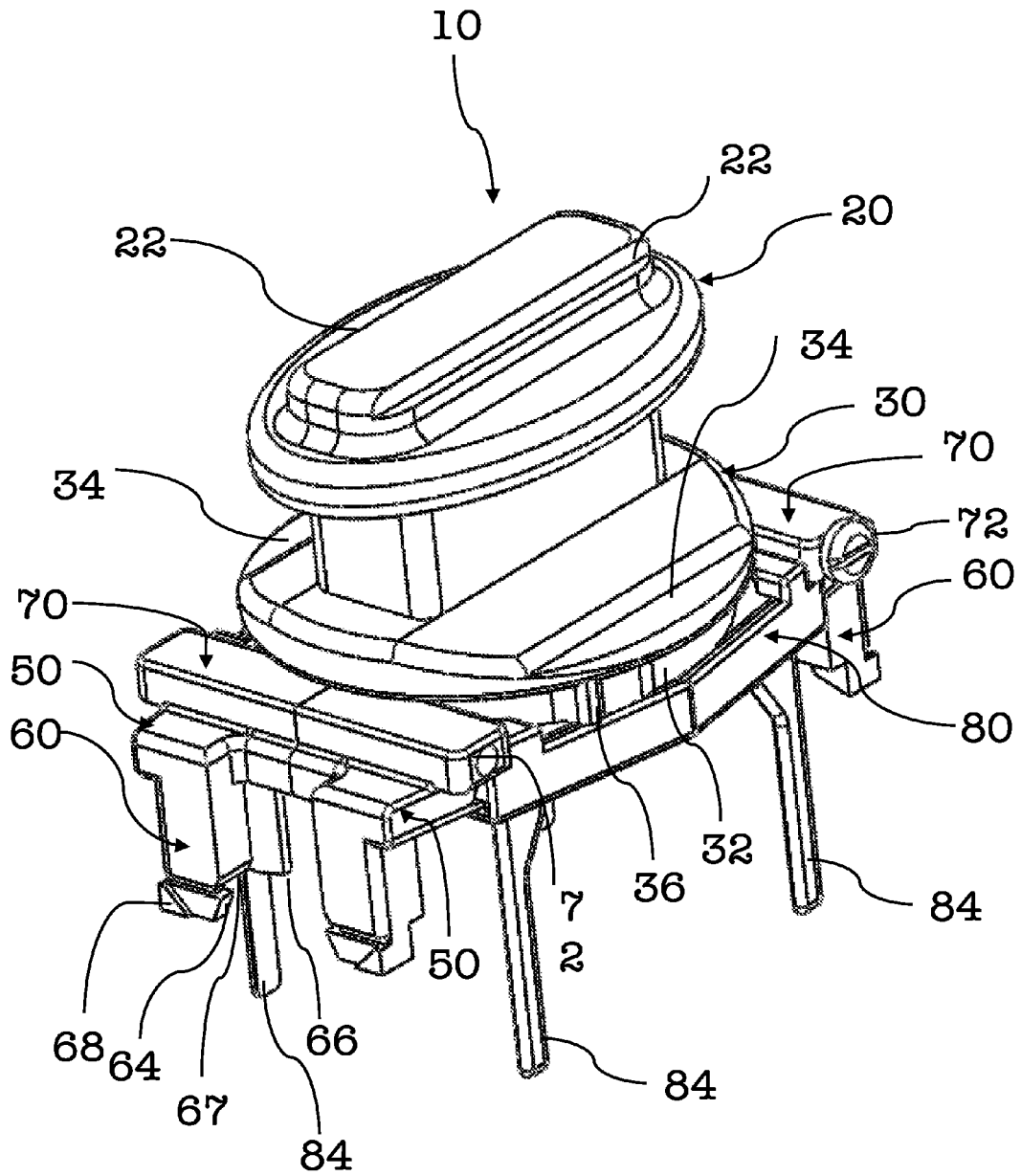
FIG. 1 is a diagram illustrating an example electrical component gripping tool in accordance with one embodiment of the technology described herein.
Figure 2:
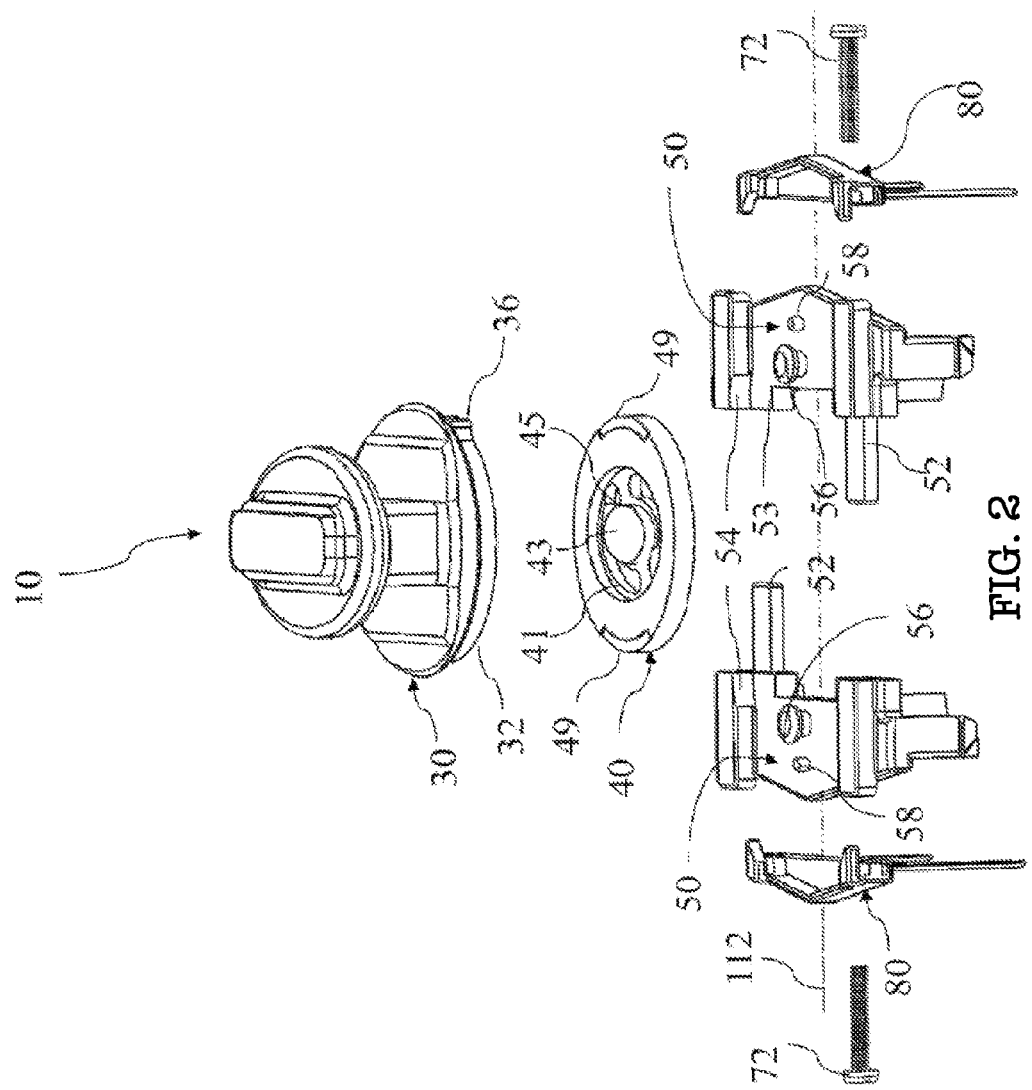
FIG. 2 is an exploded view of the example electrical component gripping tool illustrated in FIG. 1.
Figure 6:
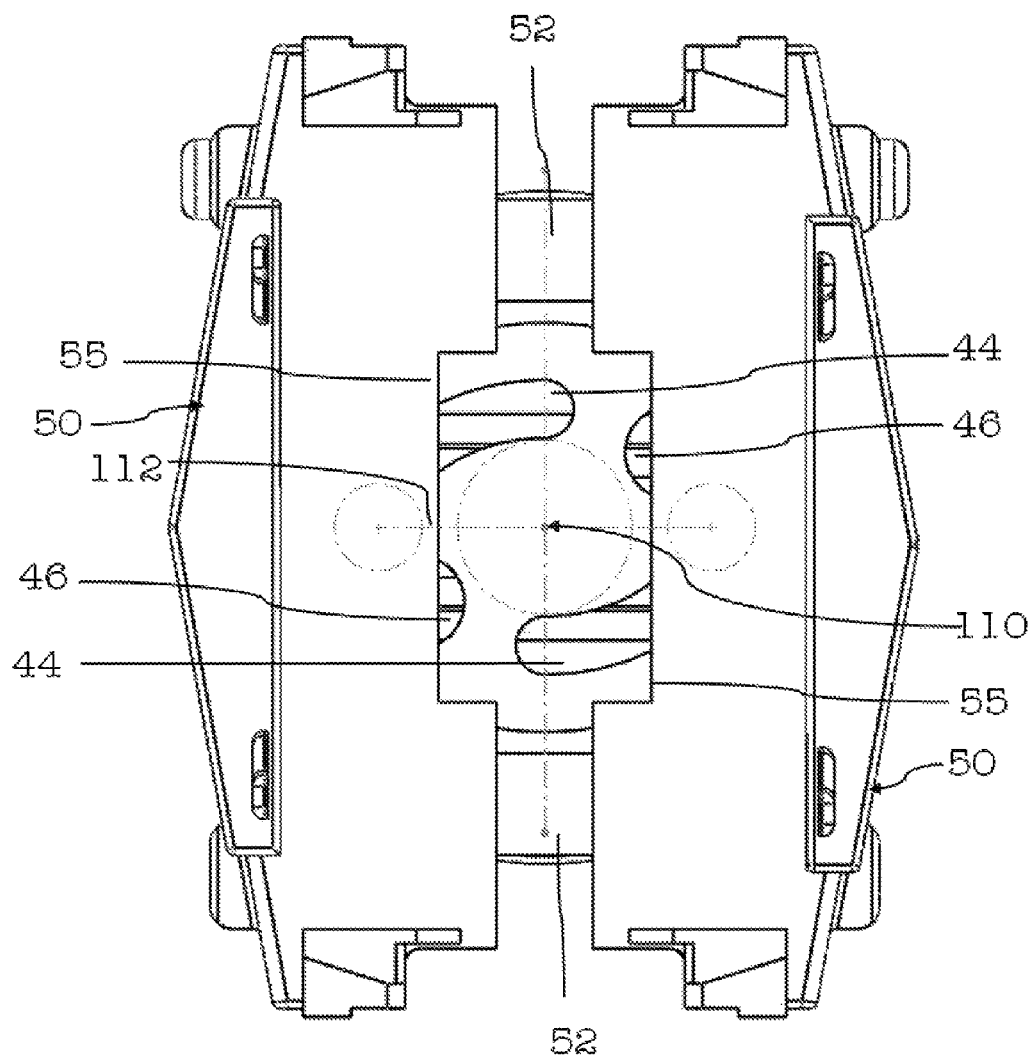
FIG. 6 is a bottom view of the example electrical component gripping tool illustrated in FIG. 1.

FIG. 1 is a diagram illustrating an example electrical device gripping tool in accordance with one embodiment described herein. FIG. 2 is a diagram illustrating an exploded view of the example electrical device gripping tool shown in FIG. 1. With reference now to FIGS. 1 and 2, the example electrical device gripping tool 10 illustrated in this example includes a handle assembly 20 which can also be considered as including a handle member, a cam holder 30, a cam 40, a gripper body 50 (in two halves), and device gripping arms 60. The handle assembly 20 can be considered as having a proximal portion which can be considered the part of the handle assembly 20 that is closest to a user in use (e.g., the portion of the handle assembly 20 which a user would grasp with a hand) and a distal end which would be the part of the handle assembly 20 furthest from the user in use, e.g., the distal part being connected or defining the cam holder 30. The handle assembly can be mounted for rotation about actuation axis 110 (FIG. 6). Cam holder 30 may be included to fixedly engage cam 40 such that rotation of handle 20 imparts a like rotation on cam 40. Cam 40 includes the guide post slots 44 (which can be considered as being variable radius cam grooves) and guide pin groove 42 (FIG. 3) that are dimensioned and positioned to engage with guide posts with locking cap 56 and cam alignment tracking pin 58, respectively on gripper body 50. In operation, rotation of handle 20 imparts a rotation on cam holder 30, which in turn rotates cam 40. Rotation of cam 40 in one direction causes the left and right body half 50 to move toward one another, while rotation of cam 40 in the other direction causes the left and right body half 50 to move away from one another.

As seen in this example, the handle portion of gripping tool 10 includes a cam holder 30, which includes a rotary axis guide 32 and a rotary axis guide contoured grip 34 to engage cam 40. Left and right body half 50 include rotary guide walls 54 that engage with rotary axis guide 32. Cam 40 is dimensioned to fit within cam holder 30 and, as noted above, in some embodiments is fixedly attached thereto such that cam 40 rotates with rotation of handle portion 20.

Body half 50 in this example further include horizontal tracking guide bar 52, horizontal tracking guide bar slot 53, cam alignment tracking pins 58, and screw holders 70 to accept screws 72 (e.g., screws used to mount the electrical device to its electrical box). The screw holders 70 may be included to provide temporary storage for the screws 72 until the screws 72 are needed when the electrical device is re-installed. As also noted above, body half 50 in this example also include guide posts with locking cap 56 and a rotary guide walls 54.

Figure 3:
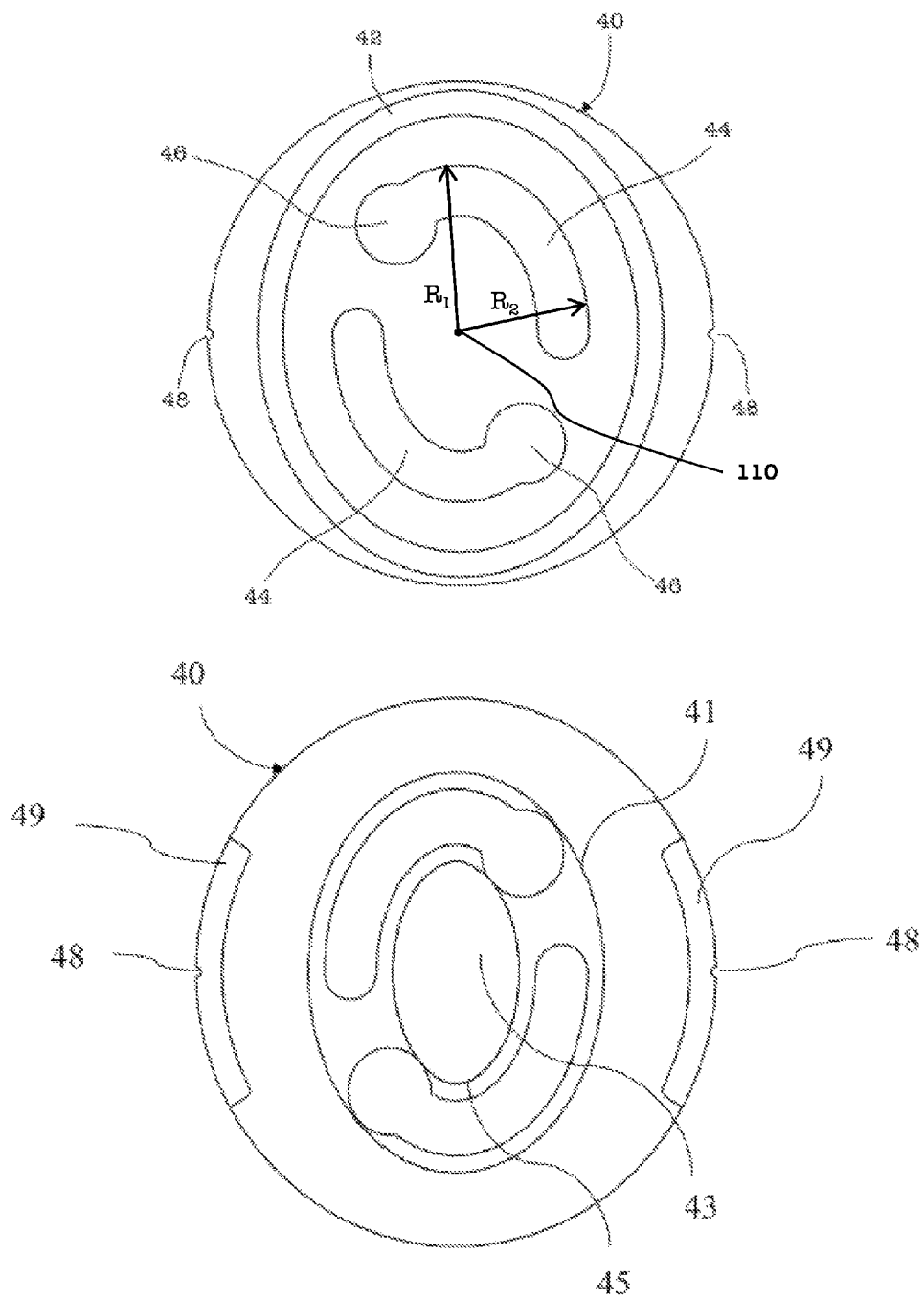
FIG. 3 is a top and bottom view of an example cam for the example electrical component gripping tool illustrated in FIG. 1.

FIG. 3 illustrates an example of a cam for use with the gripping device shown in FIGS. 1 and 2. As this example illustrates, cam 40 includes guide post slots 44, which each include a guide post loading hole 46. This example also includes a guide pin groove 42 and cam mounting alignment slots 48. The guide post slots 44 can be in the form of a variable radius groove. For example, the radius at one end of the guide post slots 44 can be different from a radius at a different location along the guide post slots 44. In some embodiments, the cam 40 can be mounted for rotation about the actuation axis 110. In some embodiments, the outer edge of the slot 44 can serve as a variable radius cam surface. For example, when the handle 20 and thus the cam 40 is rotated in the direction of the arrow in FIG. 17, the guide posts 56 are pressed inwardly by the outer edge of the slot 44. In some embodiments the radius of the slot 44 changes over its length. For example, at a position near one end of the slot 44, the slot 44, centerline of the slot 44, or the outer edge or inner edges can have a radius R1 (the outer edge being defined by the Radius R1 in FIG. 3). A at a position near the other end of the slot 44, the slot 44, centerline of the slot 44, or the outer edge or inner edges can have a Radius R2 (the outer edge being defined by the Radius R2 in FIG. 3) that is smaller than the Radius R1. Thus, the slot 44, centerline of the slot 44, or the outer edge or inner edges of the slot 44 can be considered as defining a variable radius cam surface. As seen in FIG. 2, cam 40 is dimensioned such that cam body portions 43 and 45 provide an additional outer guide face for locking cap 41 for the head of guide posts 56. This is further illustrated in the cross-sectional view provided at FIGS. 15 and 17, which is described in more detail below.

Figure 17:
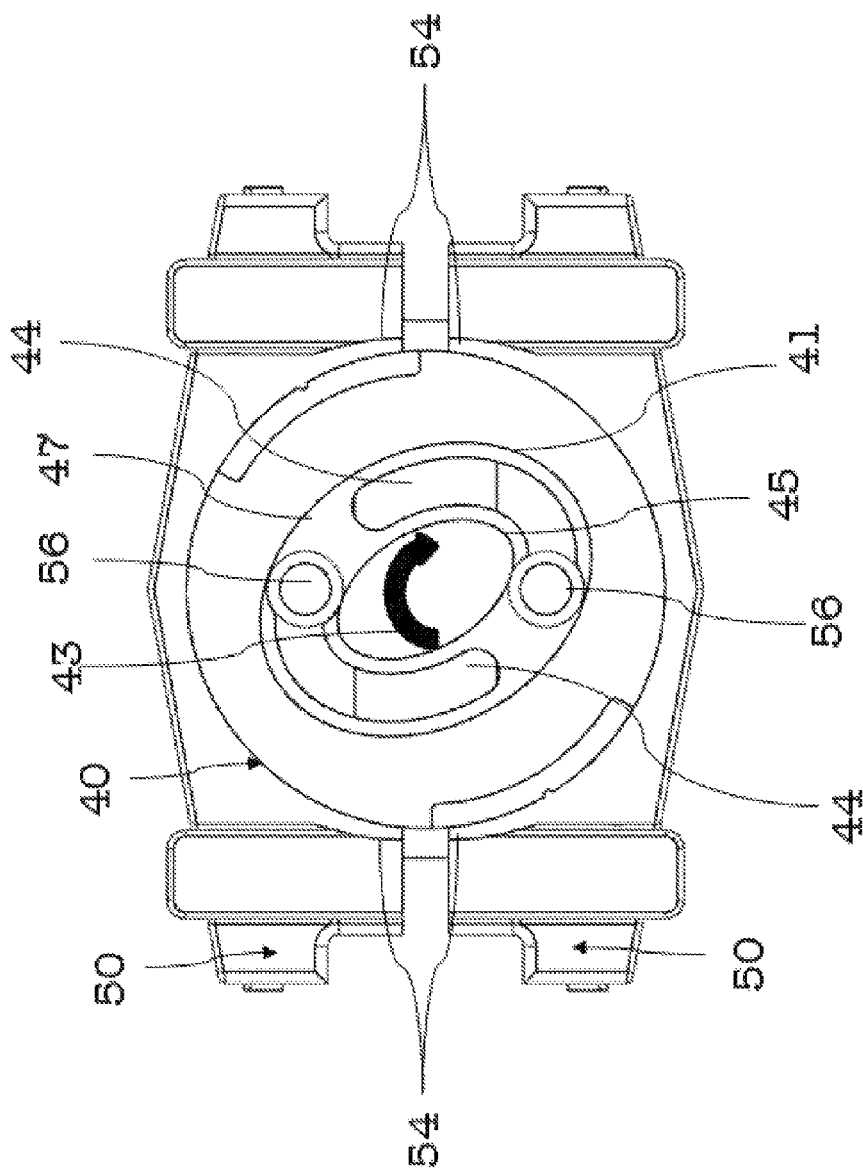
FIG. 17 is a top view or the cam and tool bodies during the assembly process.

With reference now to FIGS. 2, 3 and 17, engagement of cam 40 with body half 50 is now described. Guide post loading holes 46 are dimensioned to accept guide posts with locking caps 56 and guide pin groove 42 is dimensioned to accept cam alignment tracking pins 58. Accordingly, to engage the handle portion of the tool with body half 50, the handle portion is oriented such that guidepost loading holes 46 are aligned with guideposts 56 and the body and handle portions of the tools are mated. Rotation of the handle portion relative to the body portion enables the head portion of guide posts 56 to engage with corresponding guidepost slots 44 such that the handle portion becomes rotatably attached to the body portion.

As the example of FIG. 3 illustrates, guidepost slots 44 and guide pin groove 42 trace an elliptical path. Accordingly, when the handle is positioned relative to the body with cam alignment tracking pins 58 and guide posts with locking cap 56 positioned at opposite ends of the major axes of the ellipses formed by guide pin groove of 42 and guidepost slots 44, respectively, the body half are separated. When the handle is rotated in a direction such that cam alignment tracking pins 58 and guide posts with locking cap 56 are positioned at opposite ends of the minor axes of the ellipses formed by guide pin groove of 42 and guidepost slots 44, the two body half 50 are moved together in touching relation. Similarly, when the handle is rotated back in the other direction, cam alignment tracking guide posts 56 are pushed apart from one another as they are moved along their respective grooves, causing body half 50 to also move apart.

Cam mounting alignment slots 48 are provided in cam 40 such that cam 40 can be aligned within handle 20. Although not illustrated, cam holder 30 of handle 20 can include complementary pins to mate with cam mounting alignment slots 48 to ensure that cam 40 is properly oriented in handle 20.

Figure 4:
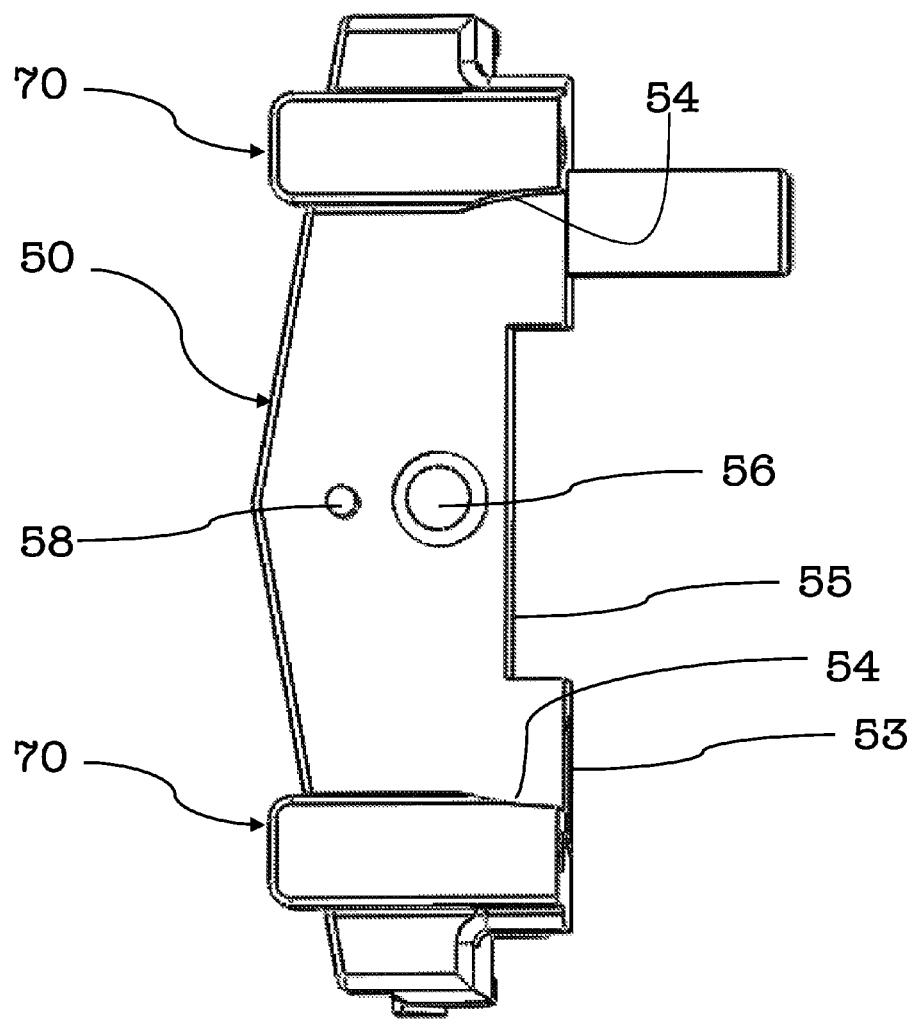
FIG. 4 is a top view of one side of an example tool body for the example electrical component gripping tool illustrated in FIG. 1.

FIG. 4 is a top view of one side of an example tool body for the example electrical component gripping tool illustrated in FIG. 1. This illustrates that cam alignment post with locking cap 56 and cam alignment tracking pin 58 are aligned horizontally along centerline 112 (FIG. 2). In this example, rotary guide walls 54 also include a radius. This radius is dimensioned to accept rotary axis guide 32 and to allow rotary axis guide 32 to rotate within the boundaries defined by rotary guide walls 54.

Figure 5:
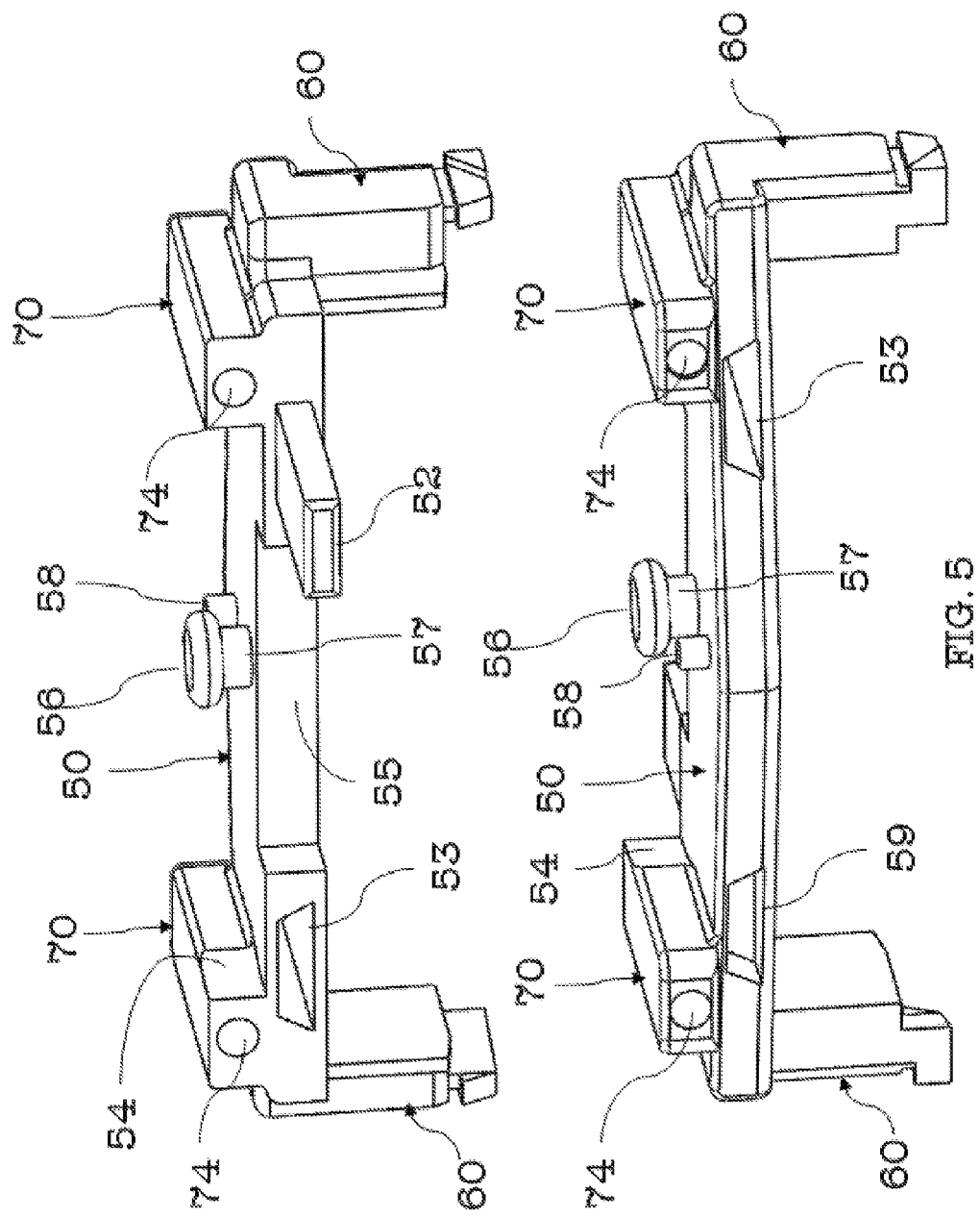
FIG. 5 are the side views of an example tool body for the example electrical component gripping tool illustrated in FIG. 1.

FIG. 5 is a side view of an example tool body for the example electrical component gripping tool illustrated in FIG. 1. This side view illustrates the profile of guidepost 56, which includes a cylindrical body portion of the first diameter and a head portion of a second, larger diameter. The larger diameter head is dimensioned to fit through guide post the loading hole 46 and engage with the guide post slot 44. FIG. 5 also illustrates an end view of horizontal tracking guide bar 52 and horizontal tracking guide bar slot 53. Tracking guide bar 52 and horizontal tracking guide bar slot 53 are positioned on each body half 50 and dimensioned such that when the body half are put together, horizontal tracking guide bar 52 of one body half aligns with and can slide into tracking guide bar slot 53 of the other body half. In the illustrated example, horizontal tracking guide bar 52 is an elongate member with a roughly rectangular cross-section. The end of horizontal tracking guide bar 52 can be tapered for easier positioning within tracking guide bar slot 53. Slot 59 partially penetrates into tool body 50 used as mounting provision for shield 80.

FIGS. 1 and 5 also illustrate gripping arms 60 that extend below the main portion of the body half 50. As described in more detail below, gripping arms 60 include structures dimensioned to engage with the electrical devices that the tool is intended to grip.

FIG. 6 is a bottom view of the example electrical component gripping tool illustrated in FIG. 1. In this example, the two body half 50 are mated with one another, but spaced apart such that the horizontal tracking guide bars 52 of each half 50 can be seen. In this configuration, horizontal tracking guide bars 52 are partially inserted into tracking guide bar slot 53. This example also illustrates that cam 40 is rotated relative to the body portion such that guideposts 56 (not visible in the drawing, but their position is illustrated by the two circles) are at opposite ends of the major axes of the ellipse formed by guidepost slots 44.

Figure 7:
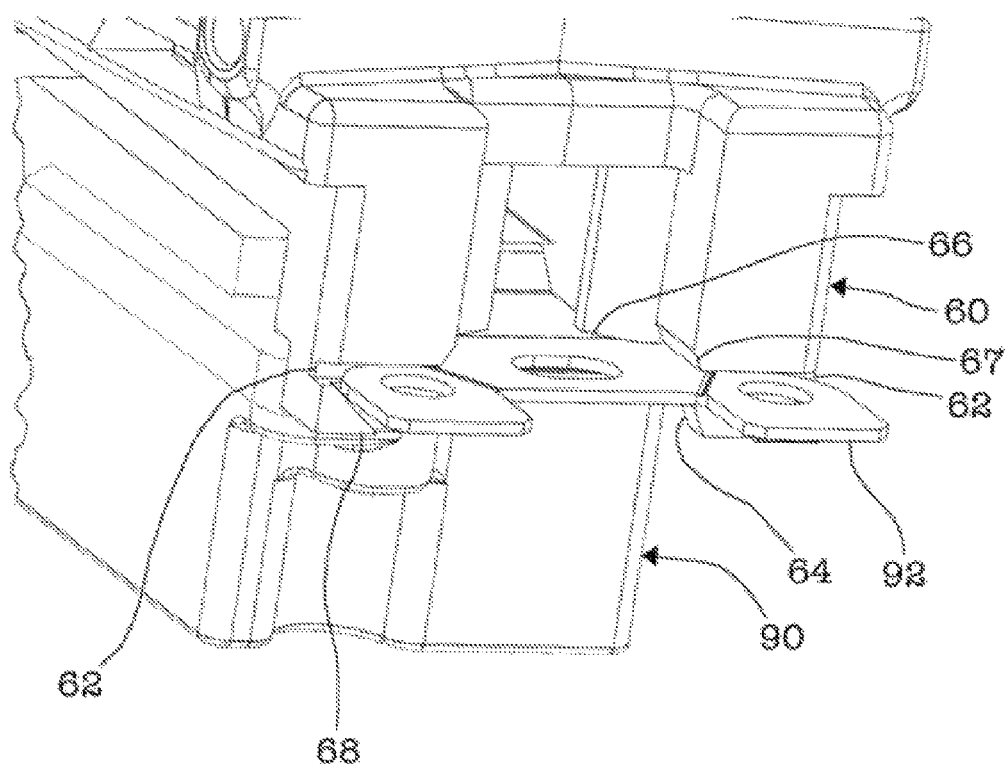
FIG. 7 is a diagram illustrating the example electrical component gripping tool illustrated in FIG. 1 in engagement with an example electrical component.

FIG. 7 is a diagram illustrating the example electrical component gripping tool illustrated in FIG. 1 in engagement with an example electrical component. In this example, electrical device 90 can be, for example, an electrical outlet, switch, or other electrical device. Electrical device 90 includes electrical device mounting bracket 92 that includes tabs extending away from electrical device 90. Mounting bracket 92 can be, for example, the metal bracket included with electrical devices to allow the device to be screwed in place in a mounting box.

As this example illustrates, gripping channels 62 are dimensioned to engage mounting bracket 92, such that when the body half are slid together (through rotation of the handle), device frame lifting wedge 68 lifts mounting bracket 92 (and consequently electrical device 90) into gripping channel 62. Locking teeth 64 are positioned under mounting bracket 92 such that when the electrical device gripping tool 10 is pulled away from the mounting box 120, the electrical device 90 is pulled with it. This example also illustrates device frame alignment guide 67 to allow mounting bracket 92 to be directed toward channel 62 when the two halves 50 are being slid together. The lifting wedges 68 can have upper surfaces 69 that face upwardly toward the handle 20. Additionally, the locking teeth 64 can have upper surfaces 65 which face toward the handle 20. Further, in some embodiments, the upper surfaces 65 can lie in a single plane P.

Figure 8:
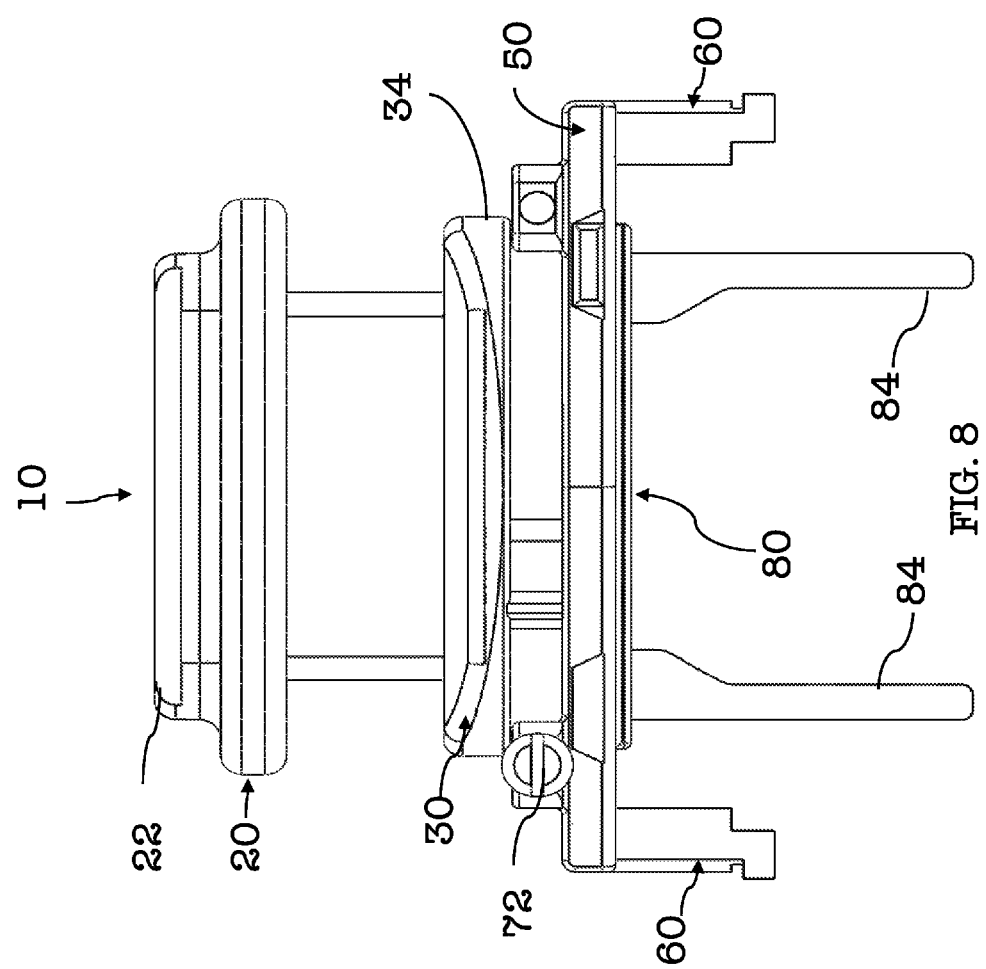
FIG. 8 is a side view of the example electrical component gripping tool illustrated in FIG. 1.

FIG. 8 is a side view of the example electrical component gripping tool illustrated in FIG. 1. This shows an example of the spatial relationship and configuration of handle 20, cam holder 30, rotary access guide con toward grip 34, body half 50 and device gripping arms 60 and shield 80.

On top of the handle, an electrical device spacer 22 may be present. The electrical device spacer 22 may help ensure that electrical devices are precisely spaced apart the required distance in order to allow an electrical device cover plate to slide between the electrical devices when installing multiple electrical devices. For example, after tightening the first electrical device into place, the user may rest the electrical device spacer 22 against the edge of the second electrical device. The user may then slide the second electrical device against the electrical device spacer 22 and tighten the screws on the second electrical device. The user can repeat procedure on additional electrical devices. The electrical devices will now have correct spacing so the electrical device cover plate will precisely fit in the area required.

Figure 9:
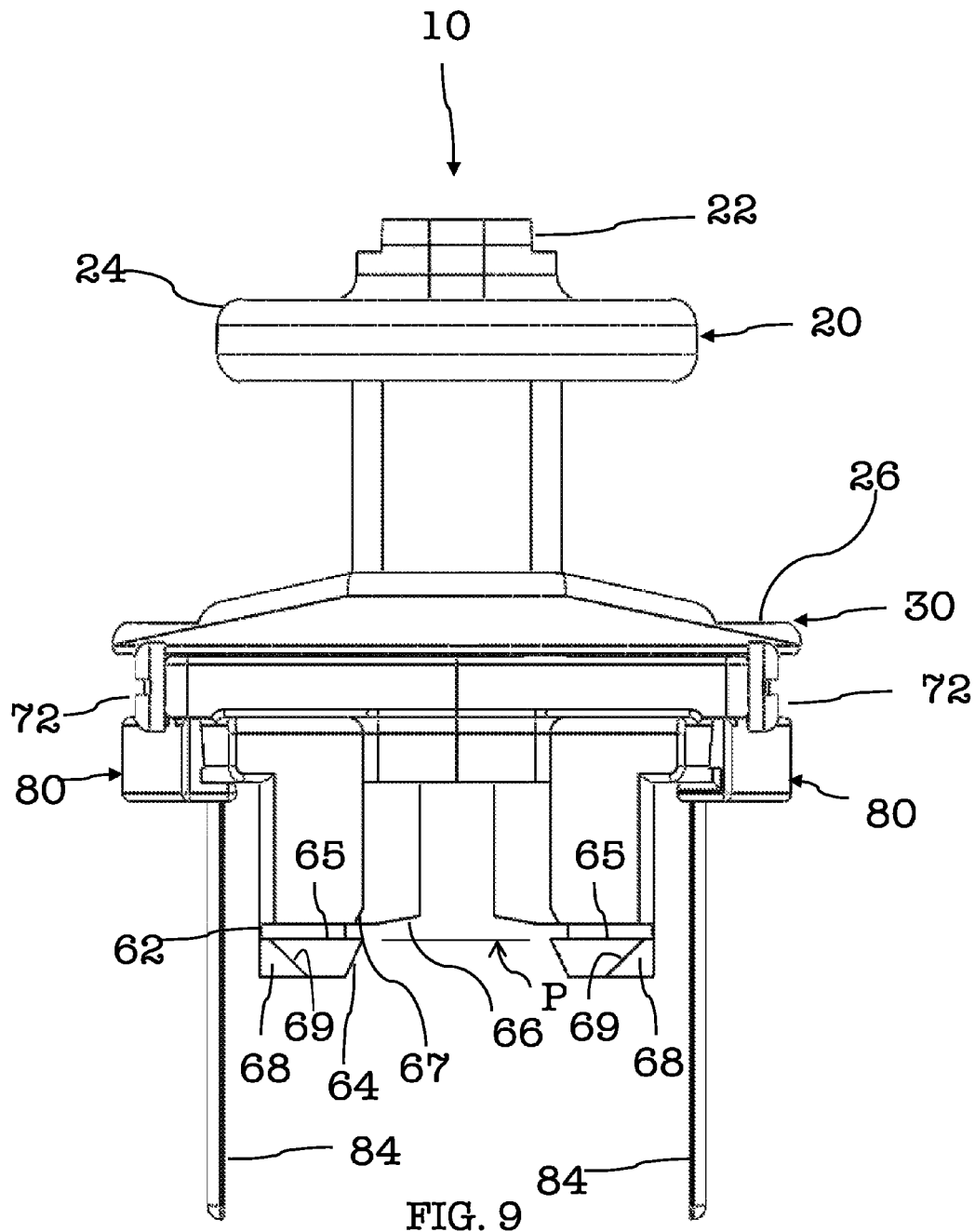
FIG. 9 is an end view of the example electrical component gripping tool illustrated in FIG. 1.

FIG. 9 is an end view of the example electrical component gripping tool illustrated in FIG. 1. This also illustrates an example of the spatial relationship and configuration of handle 20, cam holder 30, rotary access guide contour grip 34, body half 50 and device gripping arms 60 and shield 80. FIG. 9 also shows example geometries for gripping channel 62, locking teeth 64, electrical device top alignment guide 66, device frame alignment guide 67, and device frame lifting wedge 68. As can be seen in this example in the example of FIG. 1, locking teeth 64 extend inward and also define the lower surface 65 of channel 62.

Figure 10:
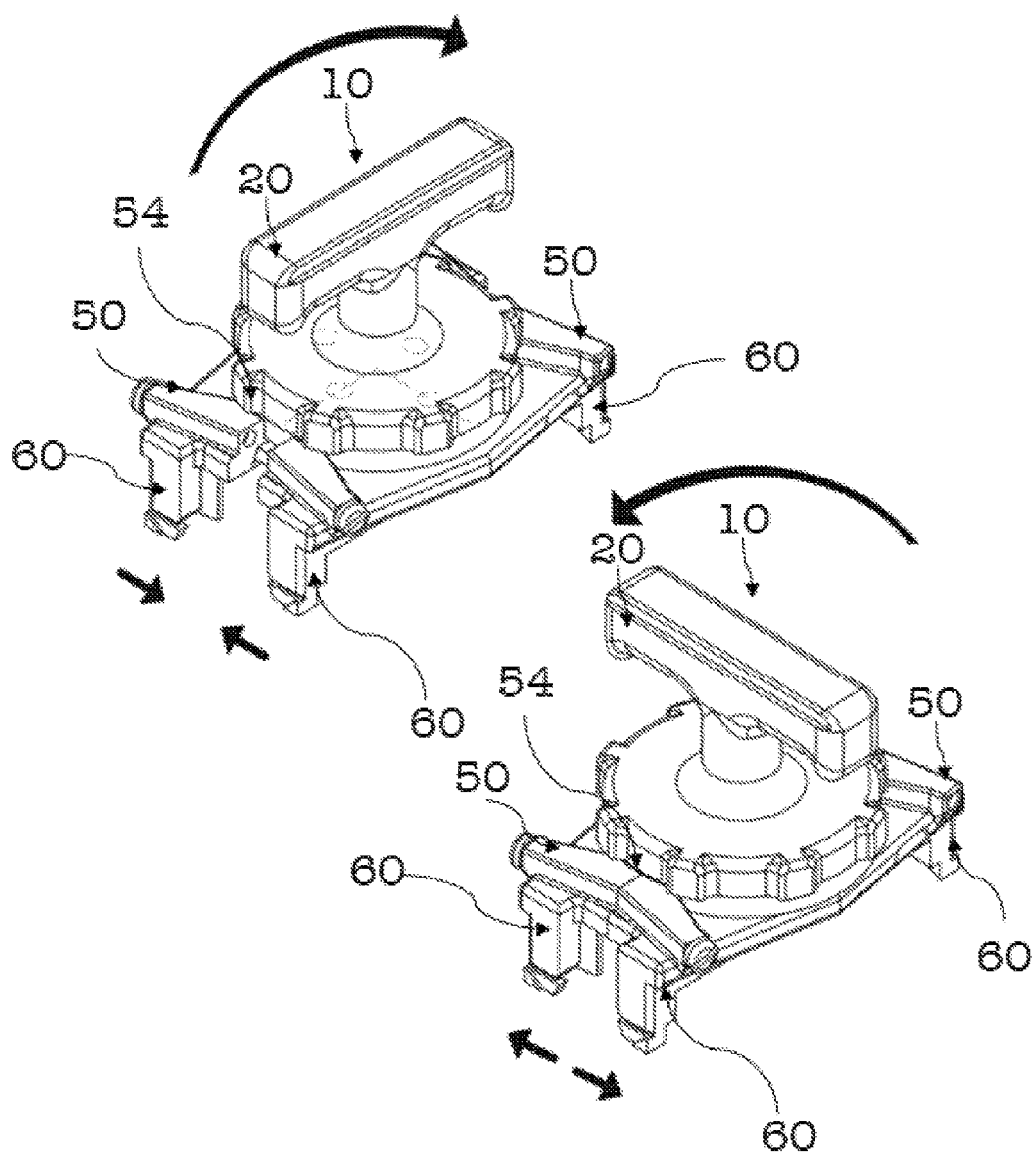
FIG. 10 is a diagram illustrating operation of the example electrical component gripping tool illustrated in FIG. 1.
Figure 16:
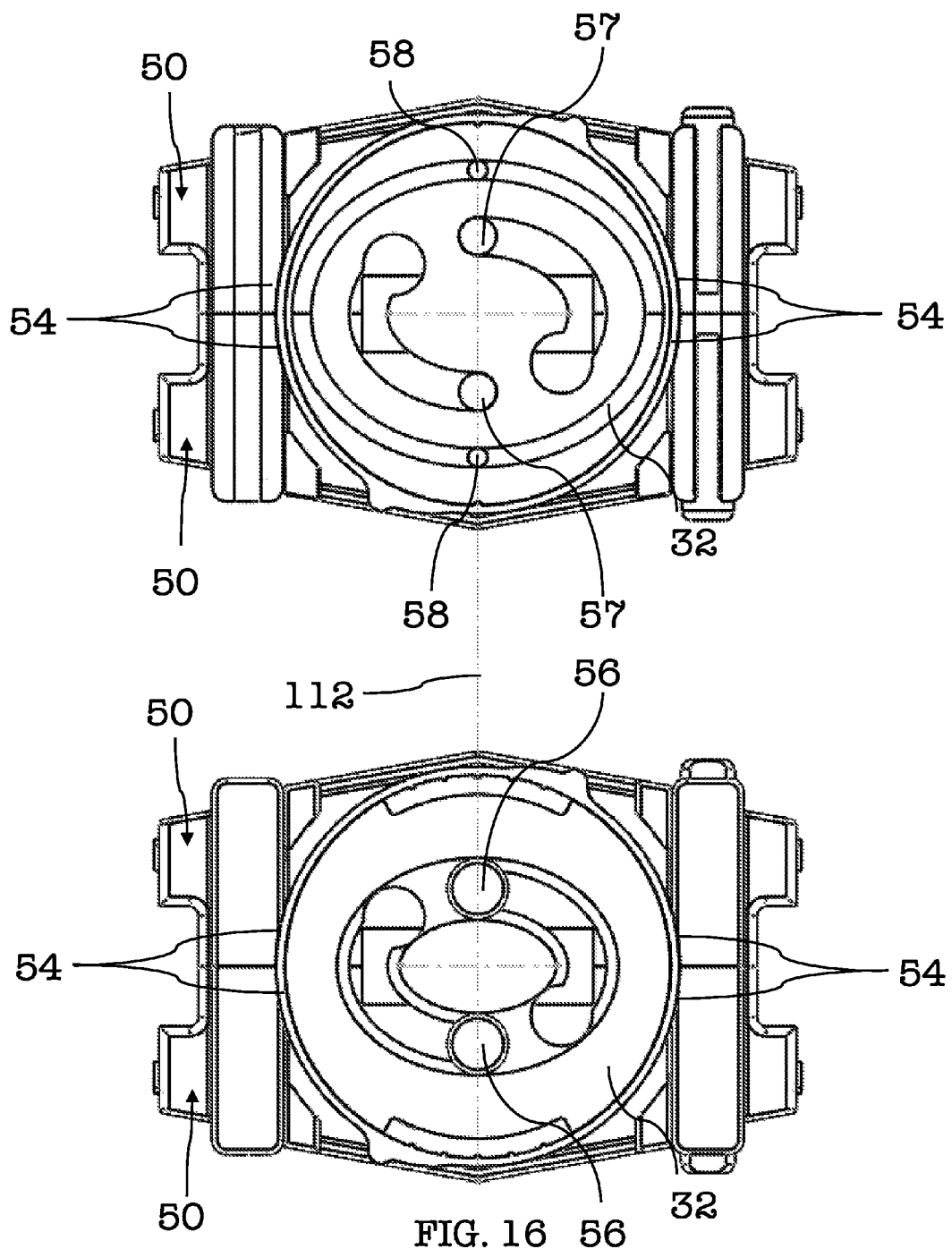
FIG. 16 is a cross section of the gripping tool showing the function of the cam and tool body.

FIG. 10 is a diagram illustrating operation of the example electrical component gripping tool illustrated in FIG. 1. As seen in this example, when the handle 20 is rotated clockwise, body halves 50 are slid together, and when the handle 20 is rotated counterclockwise the body halves 50 can be slid apart from one another. In some embodiments, the dimensions of the guidepost slots 44 and guide pin groove 42 in FIG. 3, cam 40 are chosen such that body halves 50 can be slid together until they are touching one another. They can further be dimensions such that when the handle is rotated in the other direction, the body half can be slid far enough apart from one another such that the electrical device gripping tool 10 can be seen in FIG. 19a positioned over the electrical device 90 it is intended to grip and shown in detail in FIG. 7. FIG. 16 and FIG. 17 further illustrate the combination of cam 40, guide pin grove 42, guide post slot 44, body half 50 rotary guide walls 54, cam alignment post with locking cap 56, locking cap post 57, cam alignment tracking pin 58 and handle rotary axis guide 32 that translates the rotation of handle 20 into a lateral movement of body halves 50 which are connected gripping arms 60 resulting in its intended lateral approach and locking onto the electrical device bracket 92 in the same plane. This method is uniquely different from other gripping methods such as pliers or spring loaded clamps that use a pivot point such that the gripping surfaces approach the item to be gripped on an arc. The planar motion of gripping arms 60 allows the guiding surfaces in FIG. 7, gripping channel 62, locking teeth 64, electrical device top alignment guide 66, device frame alignment guide 67, and device frame lifting wedge 68 to enhance alignment to bracket 92 and ease of gripping onto electrical device 90. The electrical device 90 can include a bracket 92 with four tabs that extend from each corner thereof, all of the tabs lying in a single plane. Thus, in embodiments in which the surfaces 65 lie in a single plane P, the surfaces 65 can make improved contact with the tabs which also lie in a single plane.

Figure 11:
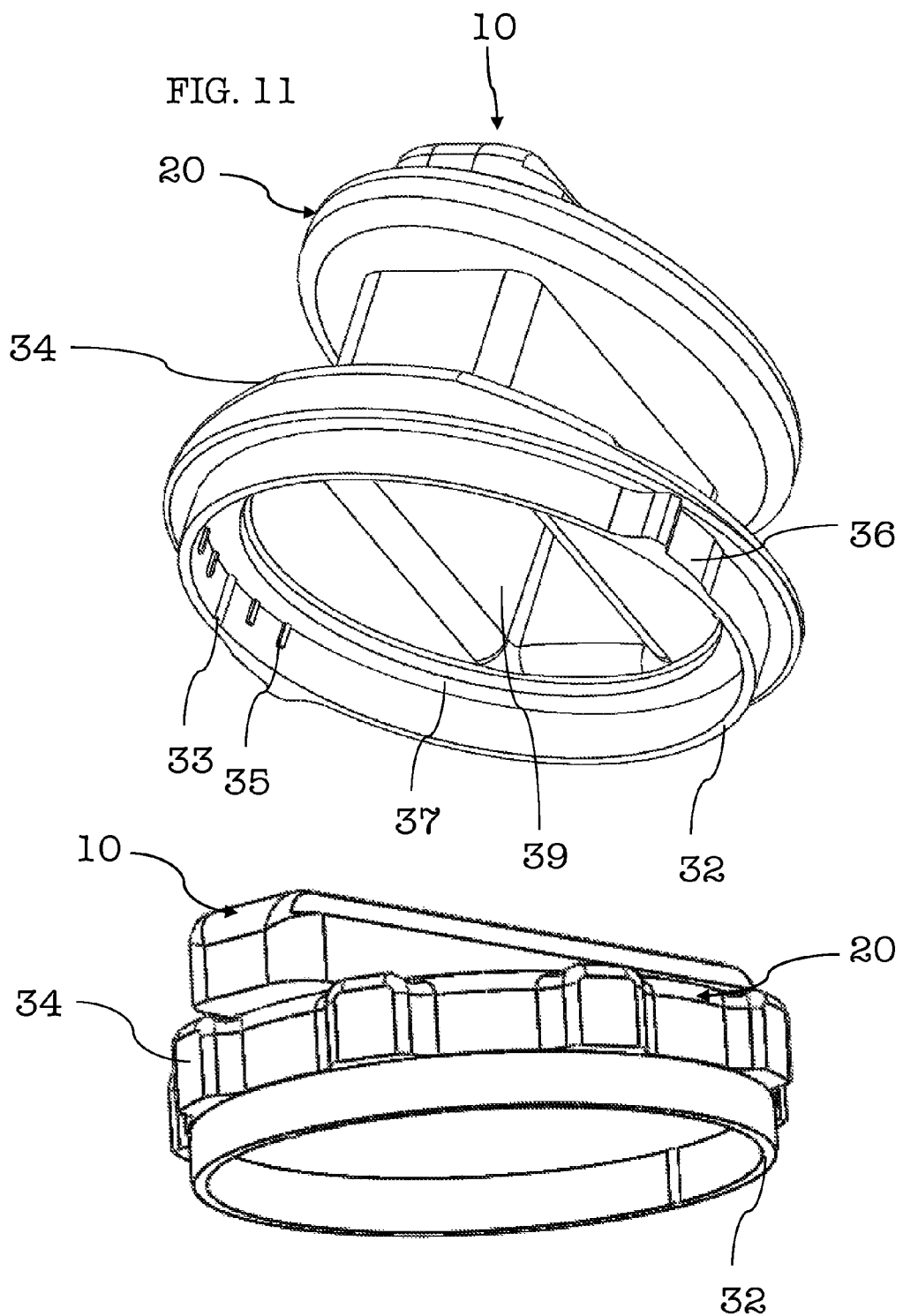
FIG. 11 is a close up view of the handle of the example electrical component gripping tool illustrated in FIG. 1.

FIG. 11 is a close up view of the handle 20 of the example electrical component gripping tool 10 illustrated in FIG. 1. As illustrated, the example gripping tool 10 includes a rotary axis guide contoured grip 34 positioned below the cam holder 30, where the rotary axis guide contoured grip 34 also sits directly above the rotary axis guide 32. By way of example, the rotary axis guide contoured grip 34 may include raised edges that are equally spaced apart to help provide a more enhanced and secure grip when handling the rotary axis guide contoured grip 34. Illustrated here are embodiments showing variations of the handle 20 and grip 34. Additionally, weldment structures 35 are indicated and are used for permanent attachments of the handle to the cam and are further explained below. Cam to handle alignment spacer 37 is dimensioned such that the handle and cam are properly aligned during the attachment process. A latch 36 may be located on the rotary axis guide 32 so that when the latch 36 is positioned in the lock position, the cam holder 30 and the handle 20 is no longer able to freely rotate, which then prevents the body half (not shown here) from sliding. Additionally, latch 36 prevents the disassembly of the handle, cam and body halves after permanent attachment.

Figure 12:
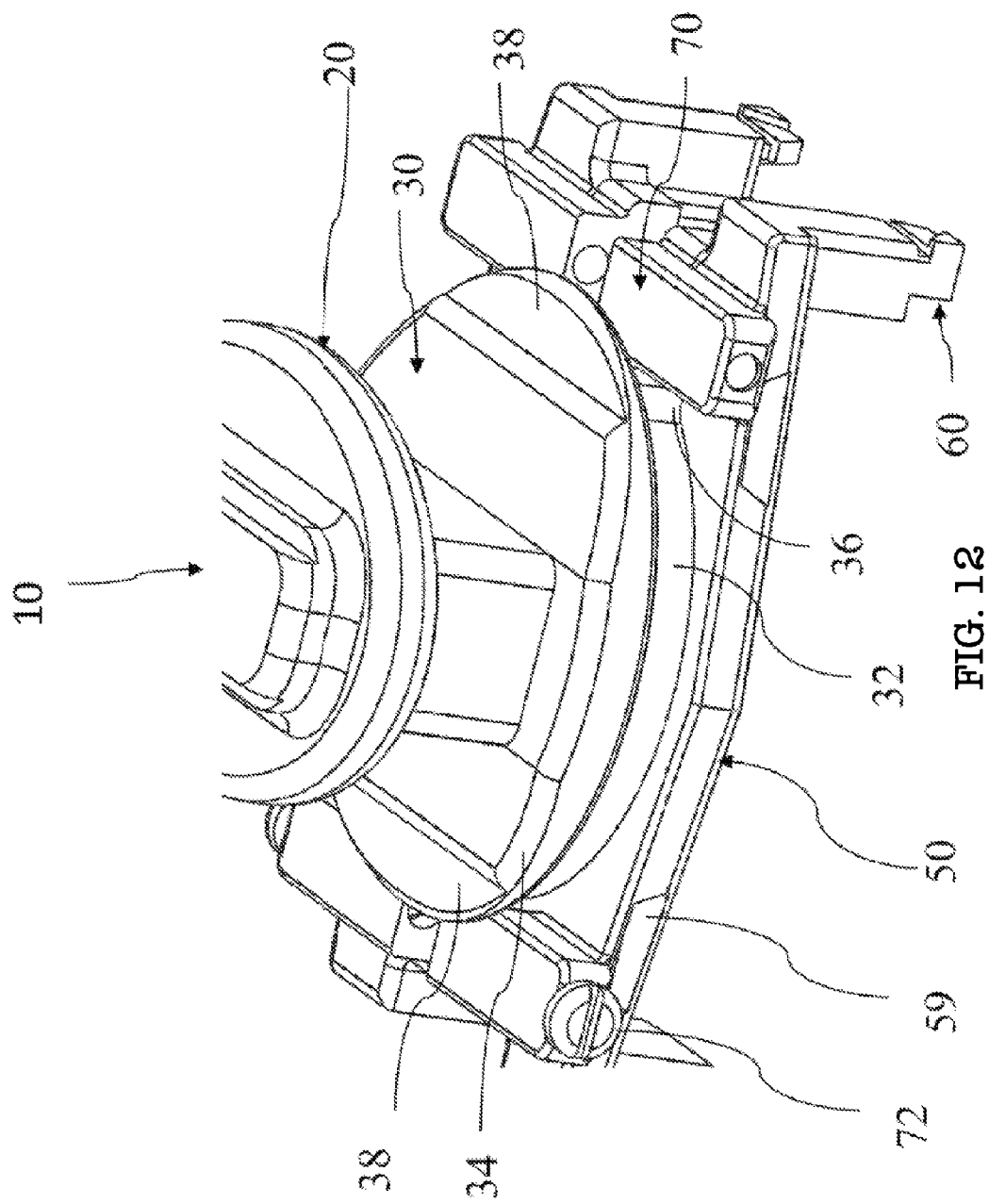
FIG. 12 is a perspective view of the example electrical component gripping tool illustrated in FIG. 1.

FIG. 12 is a perspective view of the example electrical component gripping tool 10 illustrated in FIG. 1. As this example illustrates, the gripping tool 10 includes a cam holder 30 that is encircled by the rotary axis guide 32 and the rotary access guide contour grip 34. The rotary access guide contour grip 34 may also include a latch 36 so that when engaged in the lock position, the handle is no longer able to freely rotate and remains in the affixed position. When this occurs, the body half 50 with its device gripping arms 60 also remains in its affixed position so that the body half 50 can no longer move far apart or closer to the other body half until the latch 36 is released.

Figure 13:
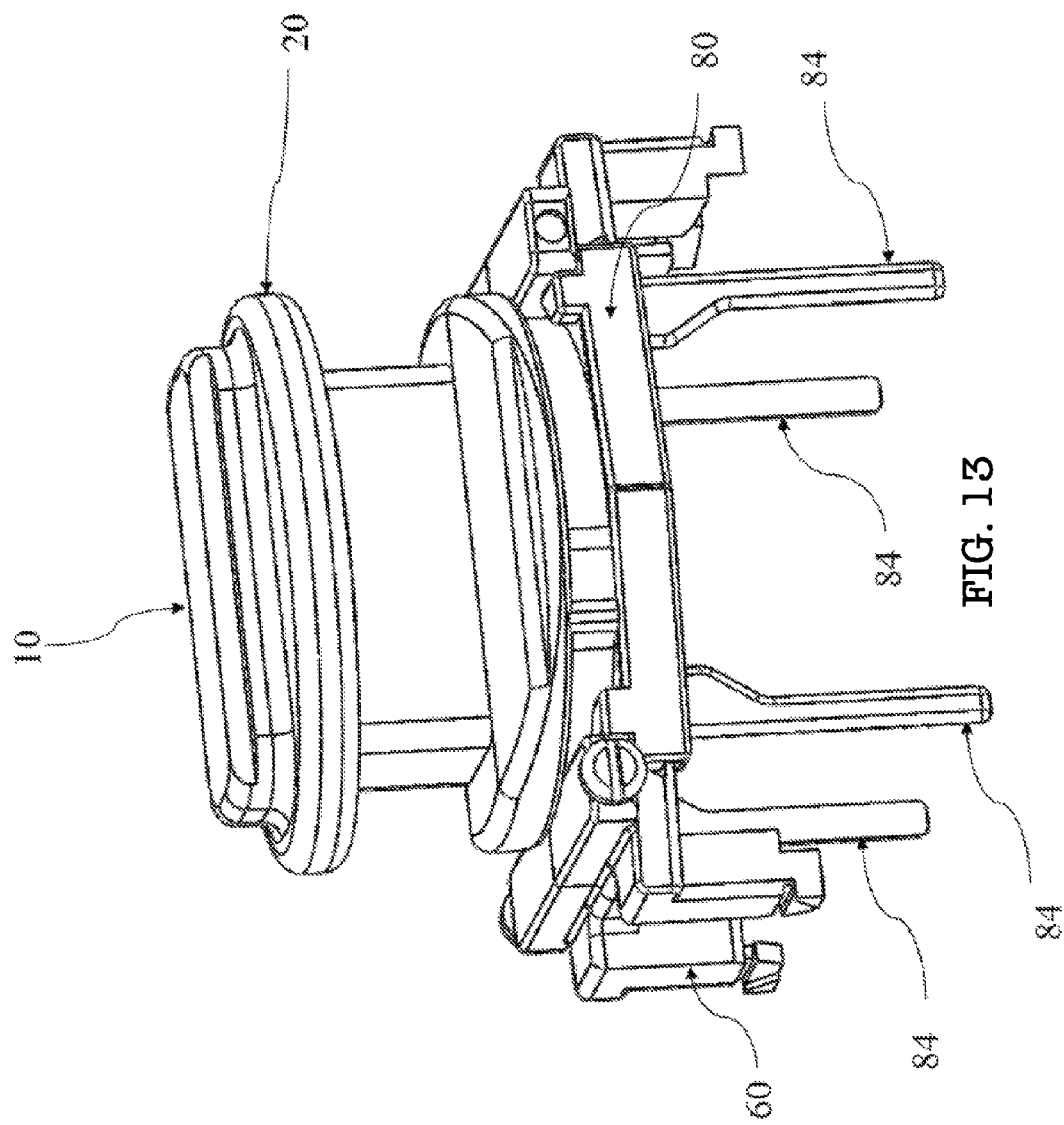
FIG. 13 is a perspective view of the example electrical component gripping tool with an example of a shield attached.

FIG. 13 is a perspective view of the gripper tool with a shield 80 attached to each of the body halves 50. As this example illustrates, when shield 80 is attached, tines 84 extend in a direction toward the electrical component to be grabbed. Tines 84 can aid alignment of the electrical component during insertion and extraction operations and assist in the prevention accidental contact of electrical device terminals and electrical casings.

Figure 14:
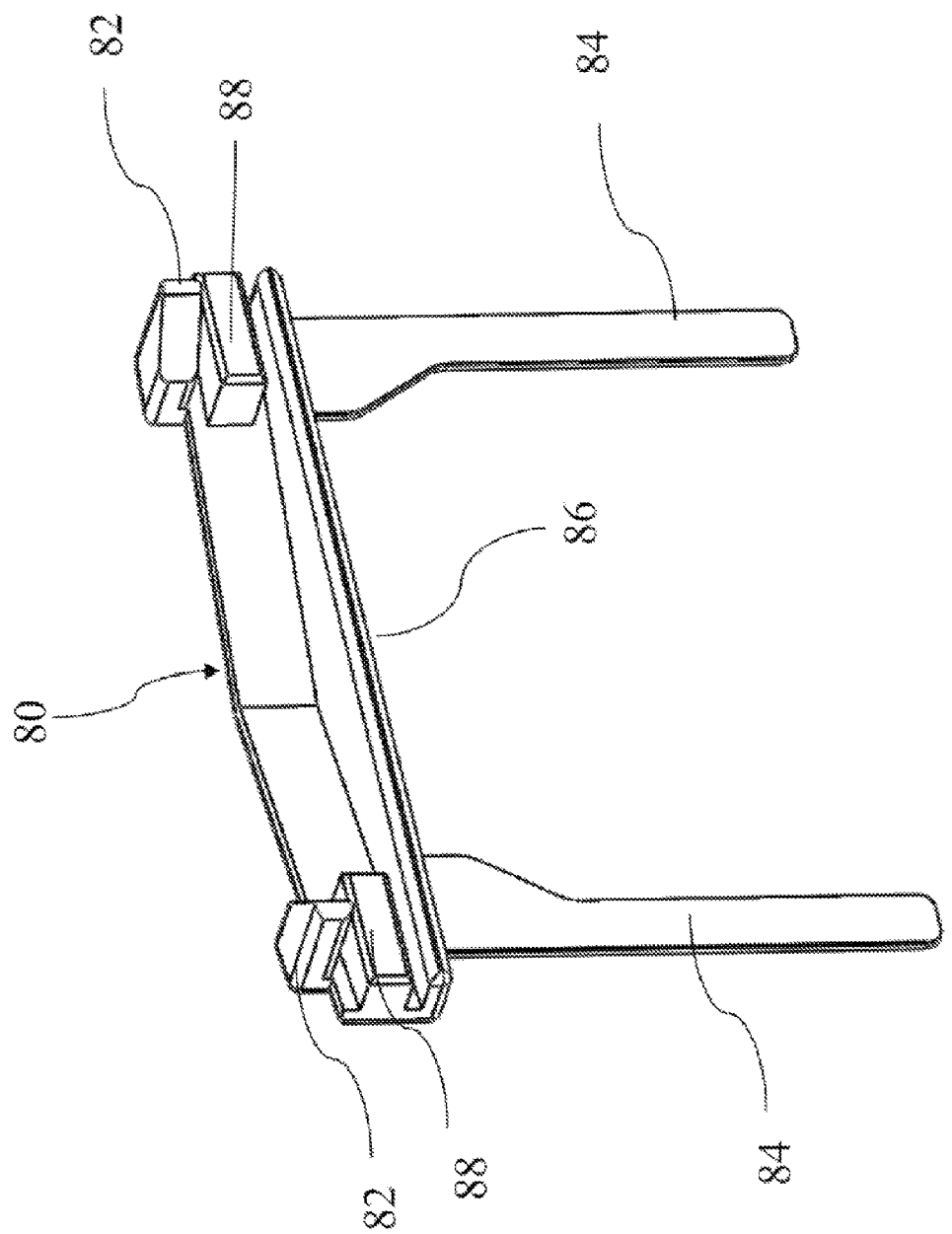
FIG. 14 is perspective drawing of the example shield.

FIG. 14 is a diagram of a shield 80 that attaches to body half 50 by means of features shield to gripper body latch 82, gripper body attachment guides 86 and lower gripper body attachment mechanism 88. Shield to gripper body latch 82 and gripper body attachment guide 86 act as a locking mechanism to attach shield 80 to body half 50 and 88 is inserted into slot 53 and 59 of body half 50 and acts as an alignment and locking mechanism.

Figure 15:
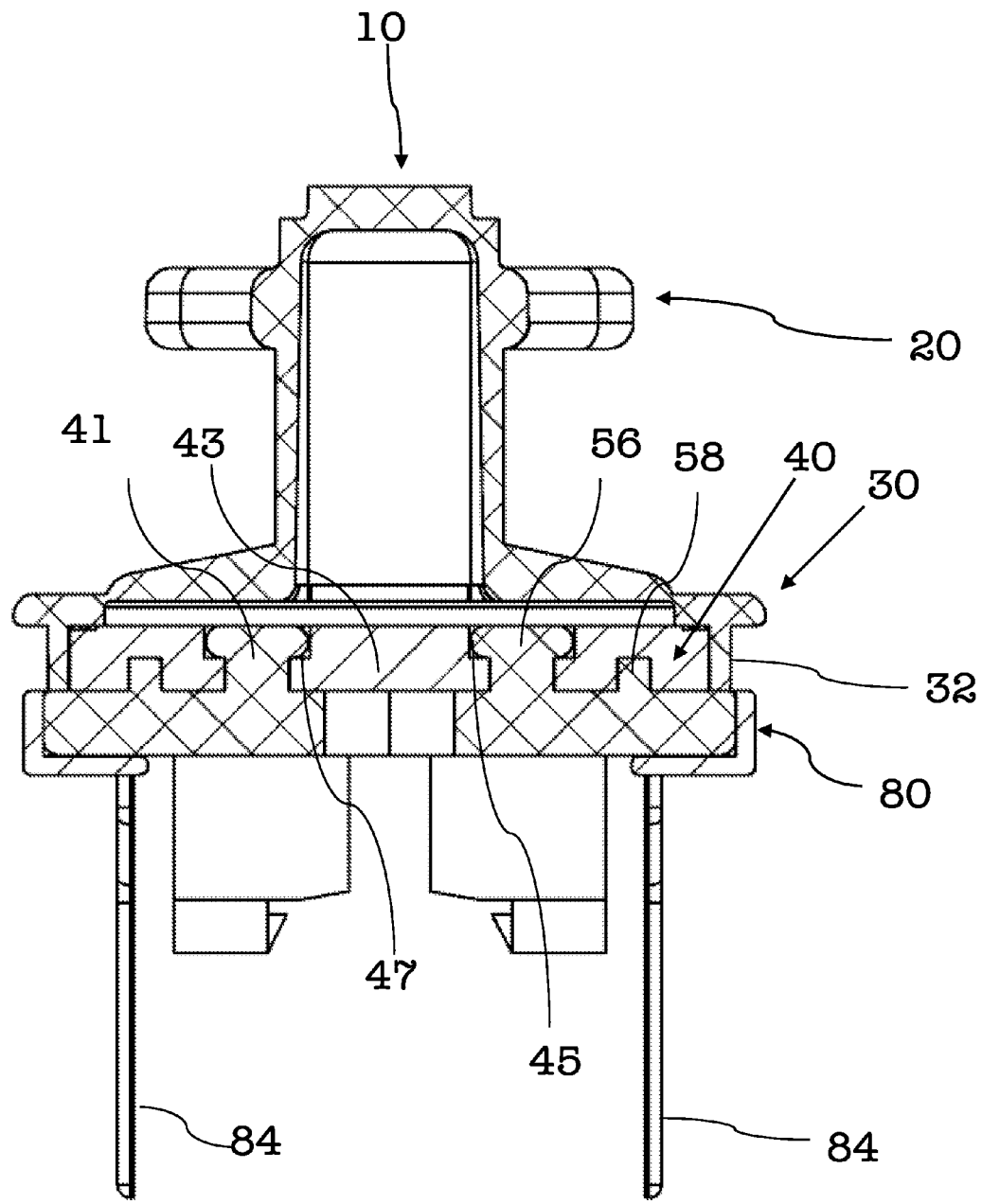
FIG. 15 is a cross-section drawing of the example electrical component tool with the example shield attachment.

FIG. 15 is a cross section of the gripper tool 10 with shield 80 attached to each half 50. This diagram also illustrates the interaction between the body halves 50 and cam 40. The cam alignment post with locking cap 56 interact with guidepost slot 41, and cam body portions 43, Inner guide face for locking cap 45 to maintain cam 40 and body halves 50 in a parallel relation as the two body halves 50 move towards or away from each other. In the illustrated examples, cam 40 is a floating cam, meaning it has no fixed center point from which to rotate about but has a virtual center point maintained by constraints body halves rotary guide walls 54, handle 32, and along with constraints from with horizontal tracking guide bar 52 and horizontal tracking guide bar slot 53.

FIG. 16 and (reference FIG. 3) show cross sections of the gripper tool at different levels showing the interactions between rotary axis guide 32 and rotary guide walls 54 showing that as body halves 50 meet rotary axis guide 32 and rotary guide walls 54 are at maximum tangency and are fully concentric. Additionally, slots guide pin groove 42 and guide post slots 44 provide tangency guide points for locking cap post 57 and cam alignment post with locking cap 56 respectively. Thus, the guide walls 54 and the rotary axis guide 32 can improve the centering of the cam 40 when the body halves 50 move toward each other as the gripper tool closes, and thereby improve alignment of the gripping arms 60; which can be looser when the gripper tool is in the open position and tighter when in the closed position. Additionally, the contact of the rotary axis guide 32 and rotary guide walls 54 when the gripper tool is closed can optionally provide additional friction therebetween when the gripper tool is closed, and thus assist in holding the tool in the closed or locked position. Walls of outer guide face for locking cap 41 and inner guide face for locking cap 45 provide tangency guide points for cam Alignment post with locking cap 56 as is slides about cam body portions 43. When the tool is in the open position this allows for the tool to have tolerance to manufacturing dimensional variations and gives the tool some freedom of movement as it is being aligned to the electrical device targeted 90 for removal. Similarly, (reference FIG. 9) Locking teeth 64, electrical device top alignment guide 66, device frame alignment guide 67, device frame lifting wedge 68, and gripping channels 62 in the open position the dimensional alignment tolerances are larger and reduce as the tool is closed forcing a locking of the electrical device 90 into the removal position.

FIG. 17 shows the assembly process of the cam 40 to the two body halves 50 by placing locking cap 56 through loading hole 46 and then rotating as indicated by the arrow until the body halves 50 are in the closed position.

Figure 18:
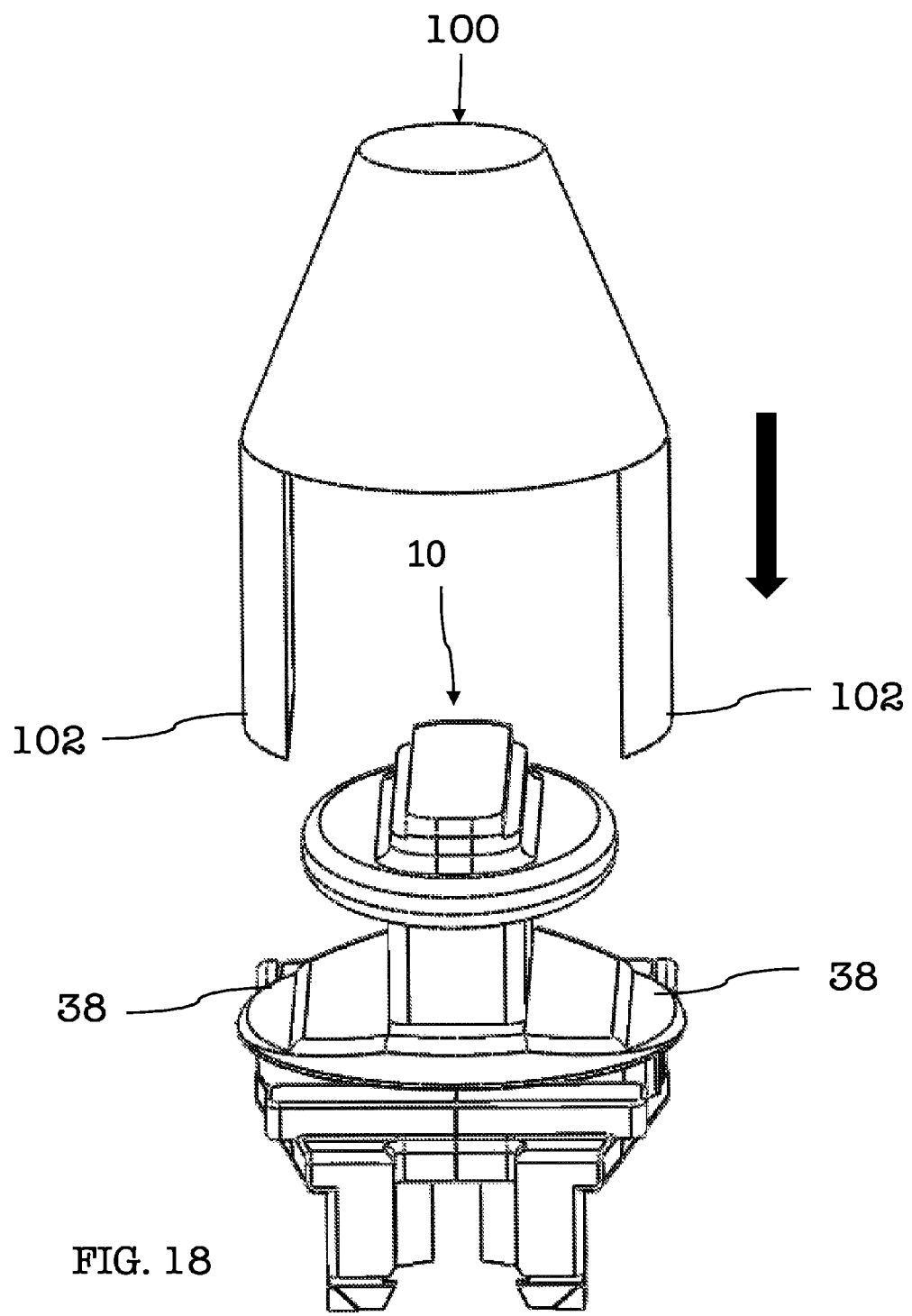
FIG. 18 is a side view of the gripping tool assembly of the handle to the cam.

Once operation shown in FIG. 17 is concluded FIG. 18 show one method of permanent attachment of handle 20 to cam 40 using ultrasonic welding. A uniquely designed ultrasonic horn 100 is designed such that it properly interfaces with the cam holder body 30 and the cam weldment platform 38.

FIG. 19 shows the sequence of events of the gripper tool in a typical application use. In FIG. 19a the Gripper tool being inserted into a typical electrical box 120, and the gripper tool 10 being attached to electrical device 90 by turning handle 20, in FIGS. 19b and 19c, and subsequently removal of the gripping tool 10 and electrical device 90 in FIG. 19d.

While various embodiments of the disclosed technology have been described above, it should be understood that they have been presented by way of example only, and not of limitation. Likewise, the various diagrams may depict an example architectural or other configuration for the disclosed technology, which is done to aid in understanding the features and functionality that can be included in the disclosed technology. The disclosed technology is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the technology disclosed herein. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the disclosed technology is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosed technology, whether or not such embodiments are described and whether or not such features are presented as being a part of a described embodiment. Thus, the breadth and scope of the technology disclosed herein should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. An electrical device gripping tool for grasping electrical devices during removal or installation thereof, the tool comprising:

a handle assembly having a proximate end, positioned proximate to a user during use and a distal end disposed distally from the user during use, the handle assembly comprising a handle member configured to be graspable by the user and rotatable about an actuation axis;

a cam member attached to the distal end of the handle assembly and comprising first and second variable radius cam grooves, the first and second variable radius cam grooves each comprising a first end and a second end, a first radius of the first end extending from the actuation axis to the first end being larger than a second radius of the second end extending from the actuation axis to the second end;

a rotary axis guide wall connected to the handle assembly, the rotary axis guide wall comprising a first rotary axis radius of curvature;

a first grasping body member comprising a first base portion, a first linear guide slot formed in the first base portion, a first linear guide post extending from the first base portion along a first direction parallel to the first linear guide slot, a first cam follower post extending from the first base portion generally perpendicular to the first linear guide post and toward the handle assembly, the first cam follower post extending though the first variable radius cam groove, the first grasping body member also comprising a first radial guide wall having a first radial guide wall radius of curvature corresponding to the first rotary axis radius of curvature, the first grasping body member also comprising first and second legs extending from the first base portion away from the handle assembly, each of the first and second legs comprising a first electronic device grasping portion comprising a first ramped face and a first grasping tooth adjacent to the first ramped face and comprising a first grasping surface extending generally parallel to the first direction and facing toward the handle assembly; and a second grasping body member comprising a second base portion, a second linear guide slot formed in the second base portion, a second linear guide post extending from the second base portion along a second direction parallel to the second linear guide slot, a second cam follower post extending from the second base portion generally perpendicular to the second linear guide post and toward the handle assembly, the second cam follower post extending though the second variable radius cam groove, the second grasping body member also comprising a second radial guide wall having a second radial guide wall radius of curvature corresponding to the first rotary axis radius of curvature, the second grasping body member also comprising third and fourth legs extending from the second base portion away from the handle assembly, each of the third and fourth legs comprising a second electronic device grasping portion comprising a second ramped face and a second grasping tooth adjacent to the second ramped face and comprising a second grasping surface extending generally parallel to the second direction and facing toward the handle assembly, wherein all of the first and second grasping surfaces lie in a single plane;

wherein the first linear guide post is disposed slidably within the second linear guide slot and the second linear guide post is disposed slidably within the first linear guide slot and wherein the first linear guide post, first linear guide slot, second linear guide post, second linear guide slot, first variable radius cam groove, second variable radius cam groove, first cam follower post and the second cam follower post cooperate to guide the first and second grasping body portions toward each other, along the first and second directions, respectively, in response to a rotational movement of the handle member about the actuation axis in which the first and second cam follower posts move from the first ends to the second ends of the first and second variable radius cam grooves, respectively;

wherein the first and second electronic device grasping portions are positioned in a retracted position in which the first and second electronic device grasping portions are spaced from each other sufficiently such that a first electronic device can be moved into a position between the first and second ramped faces and grasping surfaces and wherein the first and second electronic device grasping portions are moved to a grasping position when the handle member is rotated so as to move the first and second electronic device grasping body portions toward each other such that the first and second radial guide walls are moved into contact with the rotary axis guide wall and the first and second ramped faces slide along portions of the first electronic device until the first and second grasping surfaces capture portions of the first electronic device such that the electronic device gripping tool positively grasps the first electronic device.

2. The electrical device gripping tool of claim 1, wherein the first variable radius groove comprises a first post loading hole sized to receive an enlarged head of the first cam follower post and a second post loading hole sized to receive an enlarged head of the second cam follower post so as to affix the cam member to the first and second grasping body members.

3. The electrical device gripping tool of claim 1, wherein the cam member further comprises a guide pin groove configured to receive an alignment tracking pin on the first grasping body member and configured to align the cam member with the first grasping body member.

4. The electrical device gripping tool of claim 1, further comprising a latch attached to the cam member and moveable between unlocked and locked positions, wherein in the locked position, rotation of the handle member is prevented which results in the first grasping body member and the second grasping body member to remain in a fixed position.

5. The electrical gripping tool of claim 1, wherein the portion of the electrical device comprises a tab of an electrical outlet.

6. An electrical device gripping tool comprising:

a handle assembly having a proximate end, positioned proximate to a user during use and a distal end disposed distally from the user during use, the handle assembly comprising a handle member configured to be graspable by the user and rotatable about an actuation axis;

a cam member attached to the distal end of the handle assembly and comprising first and second variable radius cam grooves, the first and second variable radius cam grooves each comprising a first end and a second end, a first radius of the first end extending from the actuation axis to the first end being larger than a second radius of the second end extending from the actuation axis to the second end;

a first grasping body member comprising a first linear guide assembly and a first cam follower engaging the first variable radius cam groove, the first grasping body member also comprising first and second legs extending away from the handle assembly, each of the first and second legs comprising a first electronic device grasping portion comprising a first ramped face and a first grasping tooth adjacent to the first ramped face and comprising a first grasping surface facing toward the handle member; and a second grasping body member comprising a second electronic device grasping portion;

wherein the first and second electronic device grasping portions are positioned in a retracted position in which the first and second electronic device grasping portions are spaced from each other sufficiently such that a first electronic device can be moved into a position between the first and second electronic device grasping portions and wherein the first and second electronic device grasping portions are moved to a grasping position when the handle member is rotated so as to move the first and second electronic device grasping portions toward each other such that the first and second grasping surfaces capture portions of the first electronic device such that the electronic device gripping tool positively grasps the first electronic device.

7. The electrical device gripping tool of claim 6, wherein the first linear guide assembly comprises a first base portion, a first linear guide slot formed in the first base portion, a first linear guide post extending from the first base portion along a first direction parallel to the first linear guide slot wherein the second grasping body member comprises a second base portion, a second linear guide assembly comprising a second linear guide slot formed in the second base portion and a second linear guide post extending from the second base portion along a second direction parallel to the second linear guide slot, the second grasping body member also comprises a second cam follower post extending from the second base portion generally perpendicular to the second linear guide post and toward the handle assembly, the second cam follower post extending though the second variable radius cam groove, the second grasping body member also comprising third and fourth legs extending from the second base portion away from the handle assembly, each of the third and fourth legs comprising the second electronic device grasping portion which comprises a second ramped face and a second grasping tooth adjacent to the second ramped face and comprising a second grasping surface extending generally parallel to the second direction and facing toward the handle member, wherein all of the first and second grasping surfaces lie in a single plane.

8. The electrical device gripping tool of claim 7, wherein the first linear guide post is disposed slidably within the second linear guide slot and the second linear guide post is disposed slidably within the first linear guide slot and wherein the first linear guide post, first linear guide slot, second linear guide slot, second linear guide post, first variable radius cam groove, second variable radius cam groove, first cam follower post and the second cam follower post cooperate to guide the first and second electronic device grasping portions toward each other in response to a rotational movement of the handle member about the actuation axis in which the first and second cam follower posts move from the first ends to the second ends of the first and second variable radius cam grooves, respectively.

9. The electrical device gripping tool of claim 6, wherein the first variable radius cam groove comprises a first post loading hole sized to receive an enlarged head of the first cam follower post and a second post loading hole sized to receive an enlarged head of the second cam follower post so as to affix the cam member to the first and second grasping body members.

10. The electrical device gripping tool of claim 6, wherein the cam member further comprises a guide pin groove configured to receive an alignment tracking pin on the first grasping body member and configured to align the cam member with the first grasping body member.

11. The electrical device gripping tool of claim 6, further comprising a latch attached to the cam member and moveable between unlocked and locked positions, wherein in the locked position, rotation of the handle member is prevented which results in the first grasping body member and the second grasping body member to remain in a fixed in position.

12. The electrical gripping tool of claim 6, wherein the portion of the electrical device comprises a tab of an electrical outlet.

13. The electrical gripping tool of claim 6 additionally comprising a rotary axis guide wall connected to the handle assembly, the rotary axis guide wall comprising a first rotary axis radius of curvature, a first radial guide wall disposed on the first body grasping member and having a first radial guide wall radius of curvature corresponding to the first rotary axis radius of curvature, and a second radial guide wall disposed on the second grasping body member having a second radial guide wall radius of curvature corresponding to the first rotary axis radius of curvature, wherein the first and second radial guide walls are moved into contact with the rotary axis guide wall when the first and second electronic device grasping portions are moved to a grasping position.

14. An electrical device gripping tool comprising:
a handle assembly comprising a handle member configured to be graspable by a human and rotatable about an actuation axis;
a cam assembly comprising a cam member with at least a first variable radius cam surface and at least a first cam follower;
a first grasping body member comprising a first electronic device grasping portion having a first grasping surface, the first grasping surface facing toward the handle assembly; and
a second grasping body member comprising a second electronic device grasping portion having a second grasping surface;
wherein the cam assembly connects the handle assembly with the first and second grasping body members such that rotation of the cam member with the handle member causes the first grasping body member to move towards the second grasping body member for grasping an electronic device.

15. The electrical device gripping tool of claim 14, wherein when the first and second electronic device grasping portions are positioned in a retracted position, the first and second electronic device grasping portions are spaced from each other sufficiently such that an first electronic device can be moved into a position between the first and second grasping surfaces and wherein the first and second electronic device grasping portions are moved to a grasping position when the handle member is rotated so as to move the first and second grasping body portions toward each other such that the first and second grasping surfaces capture portions of the first electronic device such that the electronic device gripper tool positively grasps the first electronic device.

16. The electrical device gripping tool of claim 14, wherein the first variable radius cam surface comprises a first variable radius cam groove, the cam member further comprising a second variable radius cam groove, the first and second variable radius cam grooves each comprising a first end and a second end, a first radius of the first end extending from the actuation axis to the first end being larger than a second radius of the second end extending from the actuation axis to the second end.

17. The electrical device gripping tool of claim 16, further comprising first and second linear guide assemblies are configured to guide the first and second grasping body members along a linear direction of movement toward and away from each other.

18. The electrical device gripping tool of claim 17, wherein the first linear guide assembly comprises a first linear guide slot formed in a first base portion, a first linear guide post extending from the first base portion along a first direction parallel to the first linear guide slot, and a first cam follower, wherein the second grasping body member comprises a second base portion, a second linear guide slot formed in the second base portion and a second linear guide post extending from the second base portion along a second direction parallel to the second linear guide slot, the second grasping body member also comprising a second cam follower extending from the second base portion generally perpendicular to the second linear guide post and toward the handle assembly, the second cam follower extending though the second variable radius cam groove, the second grasping body member also comprising third and fourth legs extending from the second base portion away from the handle assembly, the third and fourth legs comprising a pair of second electronic device grasping portions, respectively, each comprising a second ramped face and a second grasping tooth adjacent to the second ramped face, the second grasping body member and comprising a second grasping surface extending generally parallel to the second direction.

19. The electrical device gripping tool of claim 14, wherein the first grasping body member comprises first and second legs extending away from the handle assembly, the first and second legs comprising a pair of the first electronic device grasping portion, respectively.

20. The electrical device gripping tool of claim 14, wherein the first electronic device grasping portion comprises a first ramped face and a first grasping tooth adjacent the ramped face, the first grasping surface being formed on the first grasping tooth.

* * * * *